United States Patent
Dove

(10) Patent No.: US 8,716,752 B2
(45) Date of Patent: May 6, 2014

(54) STRUCTURE AND METHOD FOR MAKING A STRAINED SILICON TRANSISTOR

(75) Inventor: Barry Dove, Coppell, TX (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 12/958,241

(22) Filed: Dec. 1, 2010

(65) Prior Publication Data

US 2011/0140170 A1    Jun. 16, 2011

Related U.S. Application Data

(60) Provisional application No. 61/286,268, filed on Dec. 14, 2009.

(51) Int. Cl.
*H01L 29/772* (2006.01)
*H01L 21/336* (2006.01)

(52) U.S. Cl.
USPC ............... 257/192; 257/67; 257/350; 257/19; 257/E29.242; 257/E21.409; 438/199; 438/197; 438/36; 438/37

(58) Field of Classification Search
USPC .............. 257/192, 67, 350, 19, E29.242, 257/E21.409; 438/285, 199, 197, 36, 37
See application file for complete search history.

(56) References Cited

U.S. PATENT DOCUMENTS

| | | | |
|---|---|---|---|
| 6,555,839 B2 * | 4/2003 | Fitzgerald | 257/18 |
| 6,750,486 B2 * | 6/2004 | Sugawara et al. | 257/265 |
| 6,902,965 B2 | 6/2005 | Ge et al. | |
| 7,151,019 B2 * | 12/2006 | Yang | 438/176 |
| 7,208,754 B2 | 4/2007 | Ge et al. | |
| 7,229,867 B2 | 6/2007 | Skotnicki et al. | |
| 7,238,989 B2 * | 7/2007 | Yeo et al. | 257/350 |
| 7,282,402 B2 * | 10/2007 | Sadaka et al. | 438/221 |
| 7,332,384 B2 * | 2/2008 | Buchholtz et al. | 438/150 |
| 7,436,005 B2 | 10/2008 | Monfray et al. | |
| 7,569,869 B2 * | 8/2009 | Jin et al. | 257/190 |
| 7,619,239 B2 * | 11/2009 | Irisawa et al. | 257/19 |
| 2002/0008289 A1 * | 1/2002 | Murota et al. | 257/369 |
| 2004/0171223 A1 * | 9/2004 | Hammond et al. | 438/285 |
| 2005/0279992 A1 * | 12/2005 | Gupta et al. | 257/24 |
| 2007/0029553 A1 * | 2/2007 | Ozturk et al. | 257/63 |
| 2008/0012018 A1 * | 1/2008 | Waite et al. | 257/69 |

* cited by examiner

*Primary Examiner* — Lex Malsawma
*Assistant Examiner* — Sheng Zhu
(74) *Attorney, Agent, or Firm* — Seed IP Law Group PLLC

(57) ABSTRACT

A graded SiGe sacrificial layer is epitaxially grown overlying a silicon substrate. A single crystal silicon layer is then grown by an epitaxial process overlying the graded SiGe layer. A SiGe layer is next grown by an epitaxial process as a single crystal layer overlying the silicon layer. A subsequent silicon layer, which becomes the active silicon layer for the transistors, is epitaxially grown overlying the second silicon germanium layer. Together the epitaxially grown Si, SiGe and Si layers form a laminate semiconductor structure. A MOS transistor is then formed on the active area of the single crystal silicon. The graded SiGe sacrificial layer is removed by an etch process to electrically isolate the laminate semiconductor structure from the substrate.

16 Claims, 8 Drawing Sheets

STRUCTURE AND METHOD FOR MAKING A STRAINED SILICON TRANSISTOR

CROSS-REFERENCE TO RELATED APPLICATION

This application claims the benefit under 35 U.S.C. §119 (e) of U.S. Provisional Patent Application No. 61/286,268 filed Dec. 14, 2009. The provisional application is incorporated herein by reference in its entirety.

BACKGROUND

1. Technical Field

This invention relates to silicon transistors, and more particularly to a silicon transistor having a strained channel.

2. Description of the Related Art

Complementary metal-oxide-semiconductor (CMOS) technology is a dominant semiconductor technology used for the manufacture of ultra-large scale integrated (ULSI) circuits today. Size reduction of the metal-oxide-semiconductor field-effect transistor (MOSFET) has provided significant improvement in the speed performance, circuit density, and cost per unit function of semiconductor chips over the past few decades. Significant challenges are faced when CMOS devices are scaled into the sub-100 nm regime. An attractive approach for additional improvement of CMOS transistor performance exploits strain-induced band-structure modification and mobility enhancement to increase the transistor drive current. Enhanced electron and hole mobilities in silicon (Si) under biaxial tensile strain can be achieved. Enhanced electron and hole mobilities improve the drive currents of N-channel and P-channel MOSFETs, respectively. In the strained silicon, electrons experience less resistance and flow up to 70 percent faster, which can lead to chips that are up to 35 percent faster without having to further shrink the size of transistors.

Many designs of strained silicon layers for transistor fabrication utilize buffer layers or complex multi-layer structures on a bulk silicon substrate. Strained silicon substrate technology often utilizes a silicon-germanium (SiGe) graded buffer layer with a thickness in the order of a couple microns. A relaxed SiGe layer overlies the graded buffer layer. The relaxed SiGe layer has a larger natural lattice constant than that of silicon. Relaxed crystalline silicon is said to be lattice-mismatched with respect to relaxed crystalline SiGe due to the difference in their lattice constants. The mismatch is small, which permits silicon to be grown as a single crystal aligned with the single crystal structure of SiGe. As a result, a thin layer of silicon that is epitaxially grown on the relaxed SiGe layer will be under biaxial tensile strain because the lattice of the thin layer of silicon is forced to align to the lattice of the relaxed crystalline SiGe layer, as illustrated in FIGS. 1A and 1B. Transistors fabricated on the strained silicon layer will have enhanced electrical performance.

As shown in FIG. 1A, relaxed SiGe has a lattice structure slightly larger than relaxed silicon. When pure silicon is formed as a single crystal to match the lattice structure of relaxed SiGe, the silicon is under biaxial tension, as shown in FIG. 1B. This is well known in the art and explained in detail in U.S. Pat. No. 7,208,754 incorporated herein by reference. This physical property of silicon being held under biaxial tension can be used to provide various advantages, as explained herein.

Various other techniques have been attempted to form electrically isolated transistors. Such techniques are described in U.S. Pat. Nos. 6,902,965; 7,436,005; and 7,229,867, each of which are incorporated herein by reference.

BRIEF SUMMARY

According to one embodiment, a SiGe layer has strained single crystal silicon layers positioned on a bottom side and a top side thereof. The top strained silicon layer forms the source, drain, and channel regions of a standard MOS transistor. The bottom strained silicon layer forms an etch stop to permit selective etching of the SiGe supporting the active area.

The transistor is electrically isolated from a substrate to eliminate leakage occurrence, prevent latch-up, and block other parasitic effects.

According to one embodiment, an electrical isolation material such as silicon nitrite, silicon dioxide, or other electrical insulator is positioned between the bottom strained silicon layer and the substrate. In other embodiments, the dielectric insulation may be air.

According to one embodiment, a graded first SiGe sacrificial layer is epitaxially grown overlying a silicon substrate. A first single crystal silicon layer is then grown by an epitaxial process overlying the graded first SiGe layer. A second SiGe layer is next grown by an epitaxial process as a single crystal layer overlying the first silicon layer. A second single crystal silicon layer, which becomes the active silicon layer for the transistors, is epitaxially grown overlying the second SiGe layer. Together the epitaxially grown silicon and SiGe layers form a laminate semiconductor structure. A gate dielectric is then formed overlying an active area of the second single crystal silicon, a polysilicon gate is deposited thereon and then pattern etched to form a gate electrode for a transistor. The second single crystal silicon layer forms the active area for CMOS transistors, both P-channel and N-channel. The active area is appropriately doped to form transistor regions which may include an LDD implant, Halo implants, or other threshold-adjusting implants, followed by sidewall spacers and heavy doping of the source and drain regions. The graded first SiGe sacrificial layer is at least partially removed by an etch process to electrically isolate the laminate semiconductor structure from the substrate.

In one embodiment, shallow trench isolation structures are formed in the substrate to electrically isolate portions of the substrate from each other. In alternative embodiments, shallow trench isolation structures are not present because the active area is physically separated from the substrate by etching a sacrificial layer under the active area, followed by growth of a dielectric layer between the active area and the substrate which provides complete electrical isolation.

DETAILED DESCRIPTION

Figure 1A:
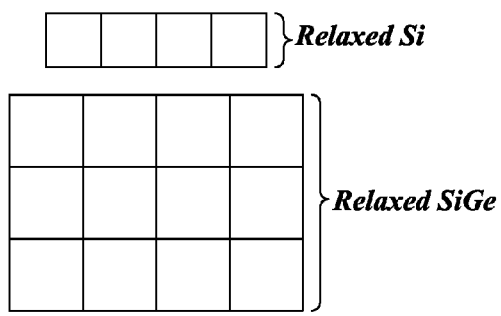
FIGS. 1A and 1B illustrate a relationship of crystalline structures between silicon and SiGe.
Figure 1B:
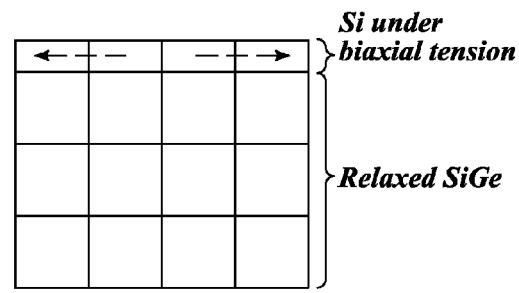
Figure 2:
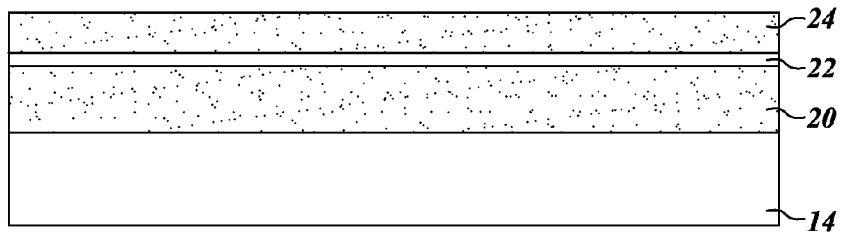
FIG. 2 is a cross-sectional view of silicon and SiGe overlying each other according to principles of one embodiment of the present invention.

As shown in FIG. 2, a graded SiGe layer 20 is grown by an epitaxial process on top of a silicon substrate 14. The SiGe layer 20 is graded having a higher percentage of silicon adjacent the single crystalline substrate 14 and gradually reducing the percentage of silicon as it grows away from the substrate 14. A single crystal silicon layer 22 is formed overlying the graded SiGe layer 20.

The amount of lattice mismatch, and thus the amount of tension on the silicon layer 22, depends on the relative percentages of Si to Ge in the SiGe layer 20. When SiGe is formed, the percentage of each of the two elements can vary based on the formula of $Si_{1-x}Ge_x$ in which x is the percentage of each of the two elements. A higher percentage of x for Si results in a lower mismatch and less stress at the junction of the silicon layer 22 and the SiGe layer 20.

Conversely, a lower percentage of Si and a higher percentage of Ge results in a greater mismatch and a higher stress. The amount of stress on the silicon layer 22 can therefore be controlled by changing the various percentages in SiGe, taking care, of course, that the mismatch does not become so high as to cause the silicon layer 22 to break or to prevent the formation of the silicon layer 22 as a single crystal on the SiGe layer 20.

The graded SiGe layer 20 has very low stress at its junction with the silicon substrate 14 because of the relatively high silicon content. The percentage of silicon is gradually reduced while increasing the germanium percentage to have a ratio of approximately 20% to 30% germanium and 80% to 70% silicon. The single crystal silicon layer 22 is epitaxially formed on a top of the graded junction SiGe sacrificial layer 20. The SiGe sacrificial layer 20 is relaxed at the top surface and therefore the silicon layer 22 formed thereon is biaxially strained. A relaxed SiGe body layer 24 is then grown as a single crystal epitaxial layer on top of the silicon barrier layer 22, which is shown in FIG. 2. The SiGe body layer 24 may also be a graded layer, with an increasing percentage of Ge towards an upper surface thereof. The silicon layer 22 and SiGe body layer 24 form part of a laminate structure 30.

Figure 3:
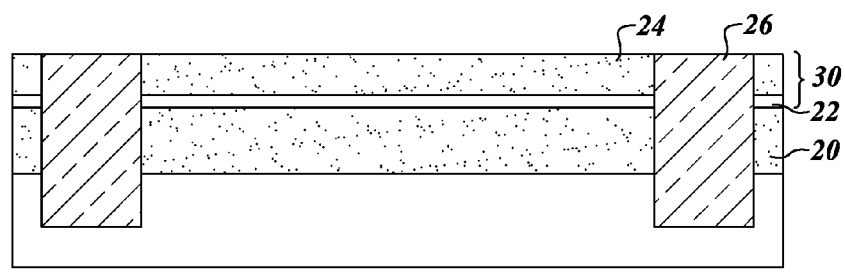
FIG. 3 illustrates a subsequent step to form shallow trench isolation in the structure of FIG. 2, according to one embodiment of the present invention.

FIG. 3 illustrates a dielectric isolation trench 26 being formed in the epitaxial layers by appropriate masking, etching, and deposition steps to form a shallow trench isolation of silicon dioxide, according to methods well known in the art.

Figure 4:
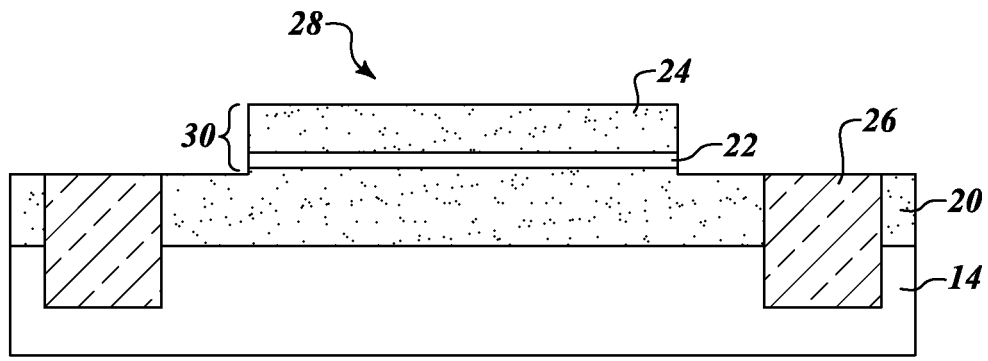
FIGS. 4-14 illustrate additional steps of forming a CMOS transistor according to one embodiment of the present invention.

As shown in FIG. 4, a portion of the laminated structure 30 is patterned and etched to leave a region 28 of the laminate structure 30 above the substrate 14. The single crystal silicon layer 22 is also etched to expose the sacrificial SiGe layer 20 at those locations where a photoresist has been removed. The etching is carried out using the single crystal silicon layer 22 as an etch stop for a first etch of the SiGe body layer 24. Subsequently, the etch chemistry is changed and the silicon layer 22 is etched with the SiGe sacrificial layer 20 acting as an etch stop during the etching of the single crystal silicon layer 22. Accordingly, the three layers can be etched with a single mask.

Figure 5:
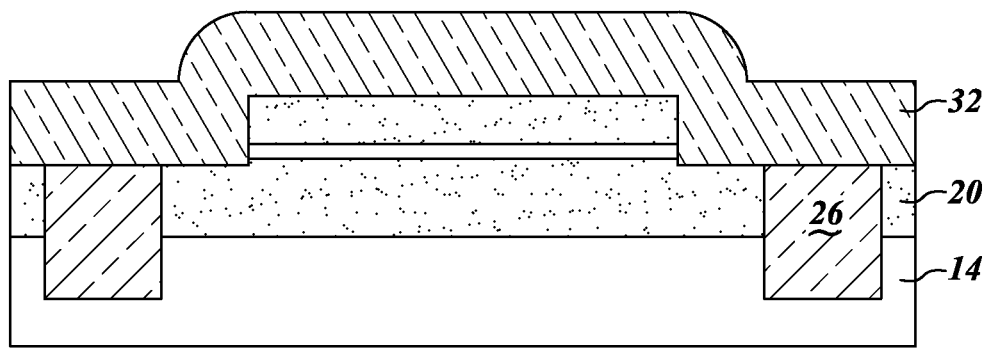
Figure 6:
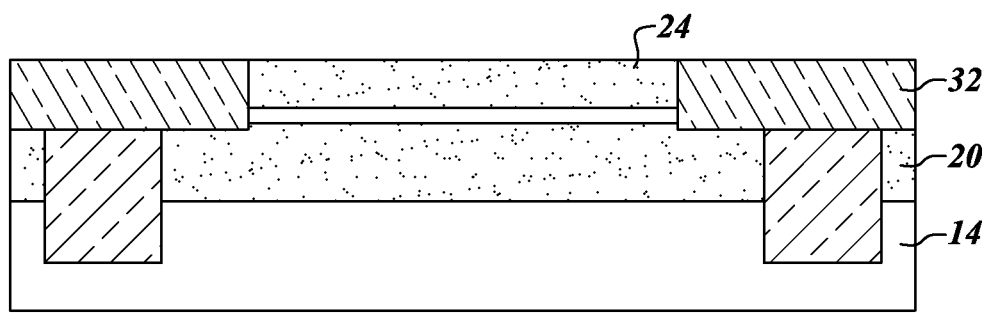
Figure 7:
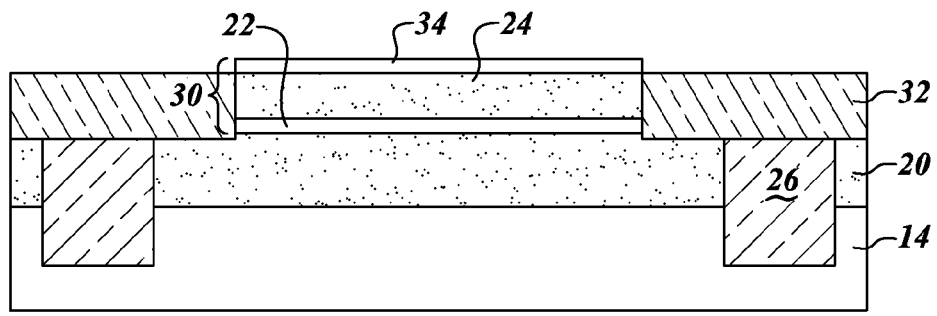
Figure 12:
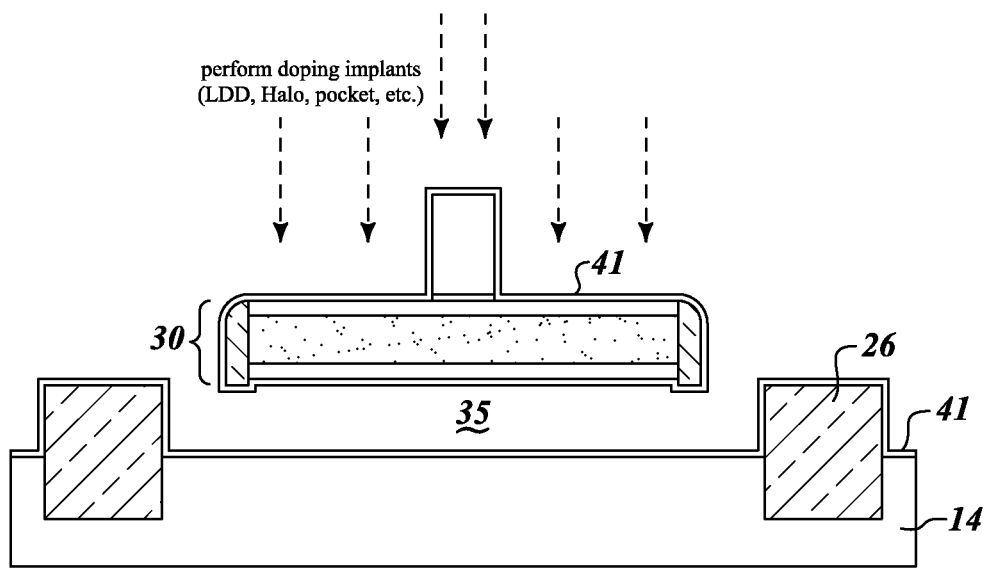

As shown in FIG. 5, a masking layer 32 is formed over the entire substrate 14, which is subsequently etched back to be planar with the top surface of the SiGe layer 24. A single crystal silicon layer 34 is then grown overlying the SiGe layer 24 adding another layer to the laminate structure 30. The masking layer 32 covers other portions of the chip besides the SiGe layer 24, preventing the epitaxial growth of the silicon layer 34 where the masking layer 32 is present. The SiGe layer 24 has a crystal lattice mismatch from single crystal silicon and therefore the epitaxially grown upper silicon layer 34 is biaxially strained. This biaxially strained silicon layer 34 will subsequently be used to form the transistor active areas of the source, drain, and channel of the various CMOS transistors, as shown in FIG. 12.

In an alternative embodiment (not shown), silicon layer 34 may be formed on SiGe layer 24 prior to the laminate structure 30 being etched (which would eliminate the need for mask 32). However, it may be preferred to maintain the extra step of using mask 32 to ensure that the thickness of silicon layer 34 is more controlled.

Figure 8:
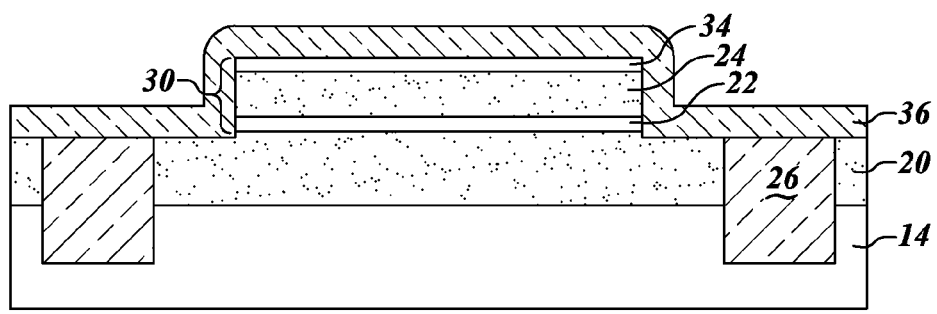
Figure 9:
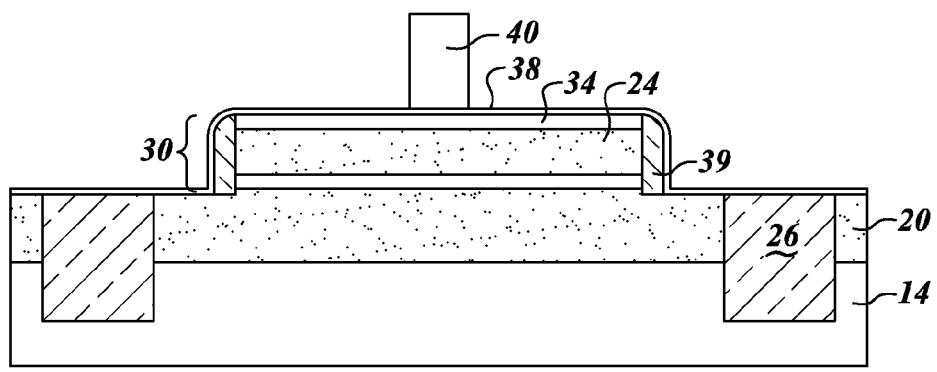

FIG. 8 illustrates a passivation layer of silicon dioxide 36 or other material conformally deposited over the laminate structure 30. It is subsequently anisotropically etched back to form sidewalls 39 on the active area of the laminate structure 30 as shown in FIG. 9. A gate dielectric layer 38 is then formed over the active area.

At this stage, the laminate structure 30 is surrounded by the silicon dioxide 38 on top and side surfaces and is supported by the graded sacrificial SiGe layer 20. The laminate structure 30 has silicon layers on the top and bottom and silicon dioxide on the sidewalls to encapsulate the SiGe layer 24 (for protection during subsequent SiGe etch steps).

Subsequently, a gate electrode 40, of either polysilicon, metal, or other appropriate gate electrode material is formed overlying the laminate structure 30. Doping of implants to form LDD and Halo pockets can be performed at the stage of FIG. 9 or later, as explained herein.

Figure 10A:
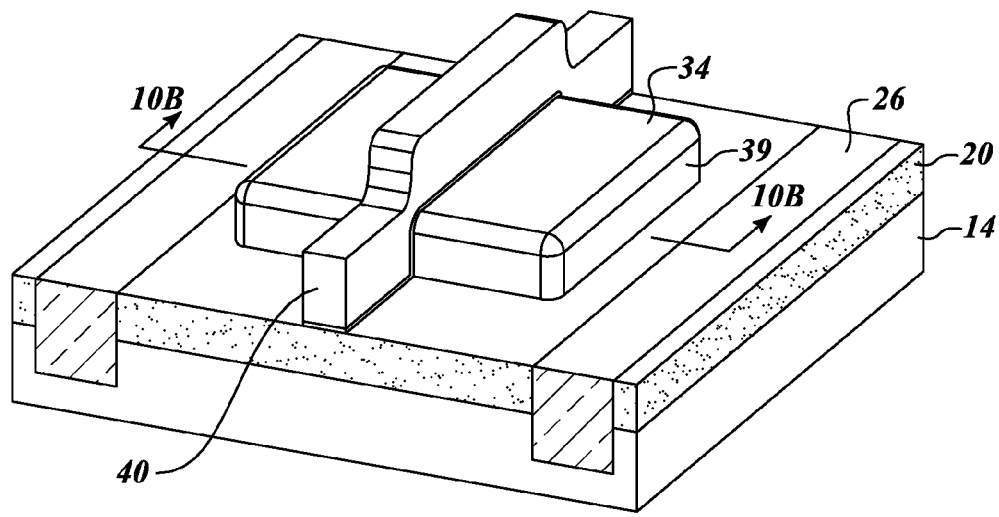
Figure 10B:
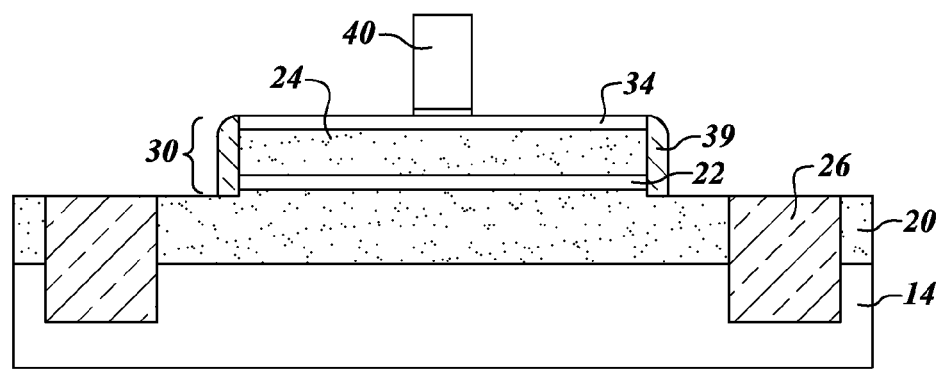

The gate dielectric layer 38 is thereafter etched, either with an anisotropic dry etch or an appropriate wet etch to remove the gate dielectric layer 38 from all places except under the gate electrode 40, as shown in FIGS. 10A and 10B.

Figure 11:
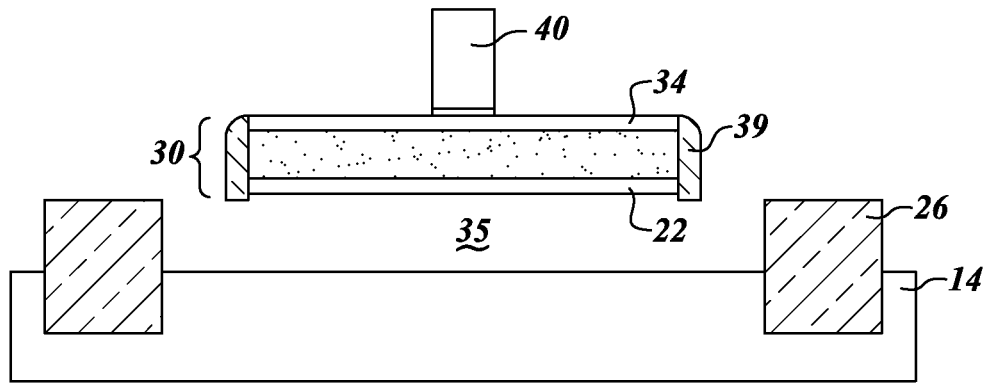

As shown in FIG. 11, the sacrificial SiGe layer 20 is then etched from under the laminate structure 30, leaving a void 35 underneath the laminated semiconductor layers. In one embodiment, the void will fill with ambient air after it is made, but it could have argon, nitrogen or other gases therein for a period of time to ensure purity of the semiconductor. The gate electrode 40 acts as a supporting bridge to hold the laminate substrate 30 in place, see FIG. 10A. Two ends of the gate electrode 40 are fixed to the SiGe layer 20, to a portion of STI 26 (out of the page and not shown in FIG. 10A), to the substrate 14, or some combination thereof. Because the SiGe layer 20 will be etched away, it may be preferred to have the gate electrode 40 extend over a portion of STI 26 for support when the SiGe layer is removed. Alternatively, a mask/etch step may be done on the SiGe layer 20 prior to the formation of the gate electrode 40, so that part of the gate electrode 40 will rest on the substrate 14 for support. In such case, it may be desirable to form an isolation layer of dielectric material in such trench to isolate the gate electrode 40 from the substrate 14. Tests have shown that this gate electrode 40 bridge has sufficient strength to hold and support itself and the laminate structure 30 of a size normally used for the active area in a transistor of this type.

Subsequent to the formation of the gate electrode 40, appropriate implants are performed to form an LDD area, Halo implant, pocket implants, and other appropriate implants as are well known in the art for CMOS transistors. Such implants can be performed after the structure of FIGS. 10A and 10B has been formed and prior to the etching of the sacrificial SiGe layer 20, after the structure of FIG. 11 is formed and the sacrificial SiGe layer 20 has been etched away, or after FIG. 12 in which a thin pad oxide 41 has been grown over the entire substrate 14 and thus provides some protective benefits to the implants being performed into the active area.

Figure 13:
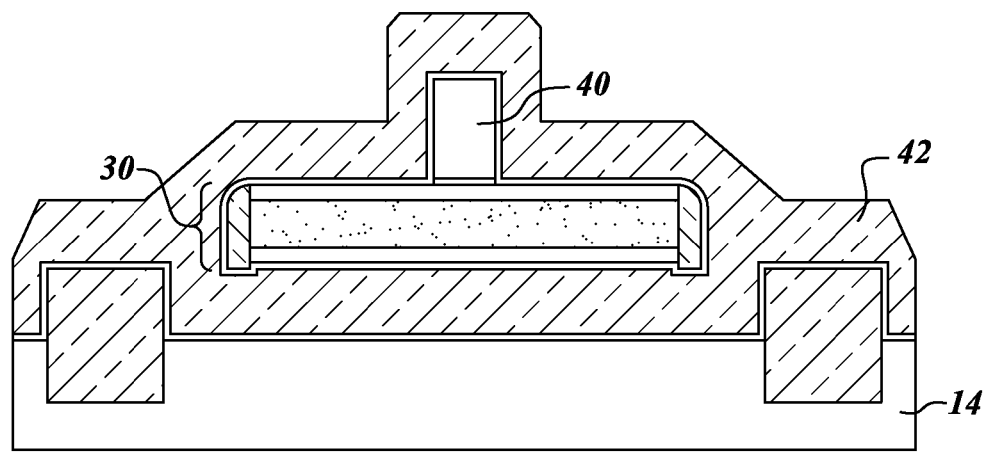

Subsequent to the initial LDD and other implants being performed, a dielectric layer 42, for example, of silicon nitride, is formed in a conformal fashion completely over the laminated structure of FIG. 12 as shown in FIG. 13. The conformal nature of the dielectric layer 42 is formed on the underparts of the laminate semiconductor structure 30, and thus provides further physical support for the laminate semiconductor structure 30 during subsequent steps in the semiconductor process. The silicon nitride or other appropriate dielectric material 42 is selectively deposited in a conformal fashion to ensure that the entire area underneath the laminated structure is completely filled, in one embodiment. Since a dielectric is used, it provides electrical isolation between the active area and the rest of the silicon substrate 14. In other embodiments, the area under the laminate structure 30 may be only partially filled to provide sufficient physical support and part may be left as a void, with air being the dielectric isolator.

Figure 14:
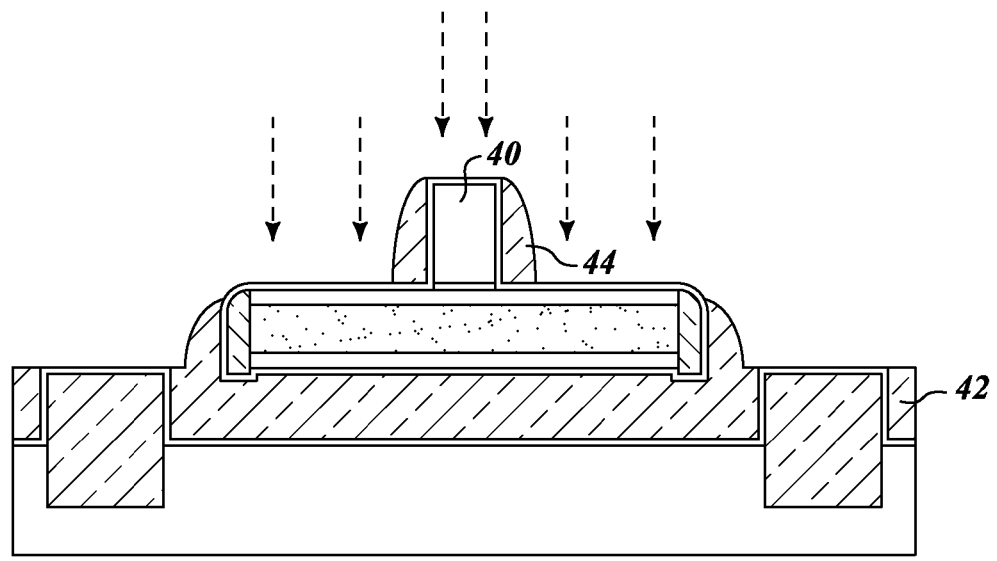

As shown in FIG. 14, the dielectric layer 42 is subject to an anisotropic etch which forms sidewalls 44 (i.e., sidewall spacers) adjacent the gate electrode 40. After the sidewalls 44 are formed, heavy doping implants are formed in the active area to completely form the source and drain regions. The gate electrode 40, if composed of polysilicon, is also heavily doped during this process. The formation of the transistor continues according to methods well known in the art to complete the formation of the integrated circuits on the semiconductor die.

After FIG. 14, the transistor formation can be continued using known processes for completing the device (e.g., forming silicide at the gate electrode, forming silicide at the source and drain regions, forming contacts) Portions of the sacrificial SiGe layer 20 may be patterned and etched to form conducting lines at that level or vias.

Some preferred thicknesses of the strained silicon layers 22 and 34 are described in U.S. Pat. No. 6,902,965. Etch chemistries for forming some of the layers of the embodiments shown in FIGS. 2-14 are well known in the art (see U.S. Pat. No. 7,229,867, for example) and thus are not described in detail herein.

Alternative ways to form the strained silicon/SiGe stack (to reduce defects) for forming the initial structure of FIG. 3 of an embodiment of the invention are described in U.S. Pat. No. 6,902,965. The graded SiGe buffer layer introduces the lattice mismatch with the underlying silicon substrate, which may result in a dispersed, three-dimensional misfit dislocation network. Strain-relieving glide of threading dislocations is facilitated. Dislocations formed in the graded buffer layer may propagate to the wafer surface, resulting in a defect density in the order of 104-105 defects per $cm^2$. Such a high defect density may present a significant barrier for the production of integrated circuits using such substrates. Also, the underlying strain fields of the misfit arrays may result in an undesirable surface roughness that potentially degrades channel mobility in active devices. A way to reduce defect density for such strained silicon substrate structures is described in U.S. Pat. No. 6,902,965, which are further alternatives to the formation of the isolation trench 26 of FIG. 3.

Figure 15A:
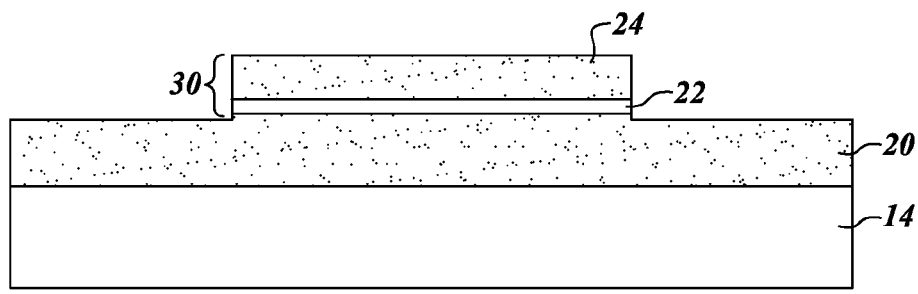
FIGS. 15A and 15B illustrate an alternative embodiment of silicon and SiGe overlying each other according to principles of the present invention.
Figure 15B:
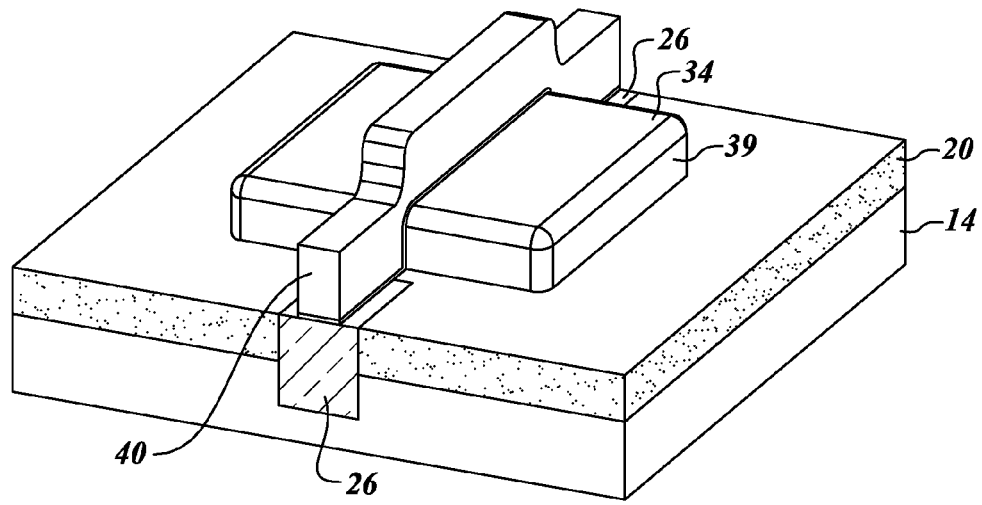

FIGS. 15A and 15B illustrate a further embodiment in which shallow trench isolation structures are not present. According to this embodiment, the graded junction of the SiGe is of sufficiently gradual grading of the junction that stress relief trenches do not need to be formed of the type shown in U.S. Pat. Nos. 7,208,754 or 6,902,965. The percentage of silicon at the top face of the SiGe sacrificial layer is selected to be the value that will give the desired stress in the silicon layer.

The amount of biaxial stress in the first silicon layer 22 is noncritical in one embodiment since this layer 22 will not form the active area. Accordingly, the crystal lattice mismatch at the first SiGe layer 20 can be very slight and provide the isolation properties desired so that there is low stress between the SiGe layer 20 and the silicon layers 22 and 34.

In the prior art, for example, U.S. Pat. No. 7,208,754, specific stress relief structures were formed to reduce the stress between the SiGe and Si layers due to the lattice mismatch. These can be used in this invention, however, in one embodiment they are not used because the percentage of Si in the layer 20 can be high enough to cause low stress in the adjacent silicon layers since it is going to be removed in subsequent steps. The active area layer is silicon layer 34. Therefore the stress in the silicon layer 34 is the factor to be controlled and the stress relationship between the silicon layer 34 and the laminate SiGe layer 24 is more controlling of the improved performance of the CMOS transistor. The layers 20 and 22 can therefore be made with closer matching of their crystalline structures and less stress at their interface. This eliminates the need for stress relief structures as were needed in the prior art, saving considerable silicon area. The second SiGe graded layer 24 is formed overlying the first single crystal silicon layer 22. This second SiGe layer 24 has a percentage of silicon at the top surface which is selected to put the desired amount of stress into the active area of the single crystal silicon 34. If a large amount of stress is desired, then a smaller percentage of silicon is present so as to increase the amount of lattice mismatch and thus increase the amount of biaxial tension in the single crystal silicon layer to be formed thereover.

There can be relatively high stress at the junction between layers 24 and 34 to improve the performance of the transistors formed in the silicon layer 34. However, since the silicon layer 34 has a smaller surface area, the stress does not build up over a large area and the stress relief structures of the prior art are not needed; rather the dielectric sidewalls and open area on each side provide a stress relief so specific structures are not needed. In this case, the etching of the SiGe 24 in FIG. 4 acts as to relieve the stress that would build up in layer 24. The layer 24 as deposited is under biaxial stress, but the size and geometry of the laminate 30 is selected such that stress is not so high as to disrupt the operation of the transistors.

As the epitaxial SiGe layers 24 and 34 are formed, they are appropriately doped, either P-type or N-type, in order to provide the appropriate body effects for the transistors to be formed. In the embodiment of FIGS. 15A and 15B, shallow trench isolation barriers are not formed adjacent the laminate semiconductor structure 30 because the lower SiGe layer 20 is a sacrificial layer that will be etched away as previously shown in FIGS. 11-14. Shallow trench isolation barriers 26 are not needed to electrically isolate the transistors from each other to avoid parasitic effects. Instead, the isolation is provided because the transistor is completely electrically isolated from other transistors in the circuit with which it may have had an undesired electrical latch-up. Because the electrical isolation is provided by a different technique, shallow trench isolation barriers are not needed and the space previously used by these barriers can be used for additional transistors or other purposes. Accordingly, significant silicon area is saved by the techniques according to the present invention.

FIG. 15A of this alternative embodiment is shown at the stage of the invention which generally corresponds to FIG. 4 of the prior embodiment. The subsequent process steps shown in FIGS. 5-14 will be carried out with respect to the embodiment of FIG. 15A with the appropriate masking, etching, and deposition steps to achieve a structure similar to that of FIG. 14, except that the trench structures 26 are not present. In such embodiment where STI 26 is not formed in the substrate 14, it may be required to add a mask/etch step to form a trench into the SiGe layer 20 to allow the gate electrode 40 to rest on the substrate 14 for support (when the SiGe layer 20 is later etched away). It may be needed to isolate the gate electrode 40 from the substrate 14 by a layer of dielectric material (e.g., in the trench formed in the SiGe layer 26 prior to forming the gate electrode 40). Alternatively, STI 26 may be formed in the substrate 14 (e.g., perpendicular to the gate electrode 40 or as a landing pad for the gate electrode 40 supported by substrate 14) outside of the transistor laminate structure 30. This is illustrated in FIG. 15B. This will still allow STI 26 to be removed from between adjacent transistor laminate structures 30 to allow the structures to be formed closer together while still providing a support and isolation for the gate electrode 40 when the SiGe layer 20 is etched away.

In one alternative embodiment, stress relief structures are formed in the SiGe layer 24 and the silicon layer 34. If the stress between the two layers exceeds the amount that would cause cracking, then stress reduction structures of this type can be formed in the laminate structure 30 as well.

Figure 16:
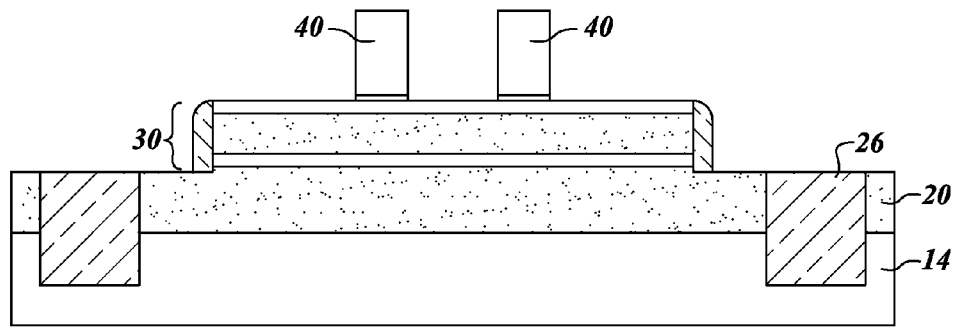
FIG. 16 illustrates a cross-sectional view of another embodiment of silicon and SiGe according to principles of the present invention.

FIG. 16 shows an embodiment in which a plurality of transistors are formed in a single laminate structure 30. FIG. 16 is shown as generally corresponding to the same step in the process of FIG. 10 of the prior embodiment and subsequent etching steps will be carried out with respect to this embodiment to correspond to FIGS. 11-14.

According to the embodiment of FIG. 16, a plurality of transistors will be formed on the common laminate structure 30, even though only 2 are shown. In one embodiment, a large array of transistors may be formed. These transistors are preferably in a circuit in which it is desired to electrically connect specific terminals of the transistors to each other. For example, in some circuits it is desired to couple the sources of adjacent transistors to each other or the drain of one to the source of the other. For such circuits, both transistors can be formed in the single semiconductor laminate structure 30 and be positioned closely adjacent to each other. The size and surface area of the laminate structure 30 of the embodiment of FIG. 16 may be quite large and will have a larger number of gates 40 that act as bridges to support the laminate structure 30. In a structure like that of the embodiment of FIG. 16, it is also possible for STI regions to be formed within the laminate structure 30 as needed.

Figure 17:
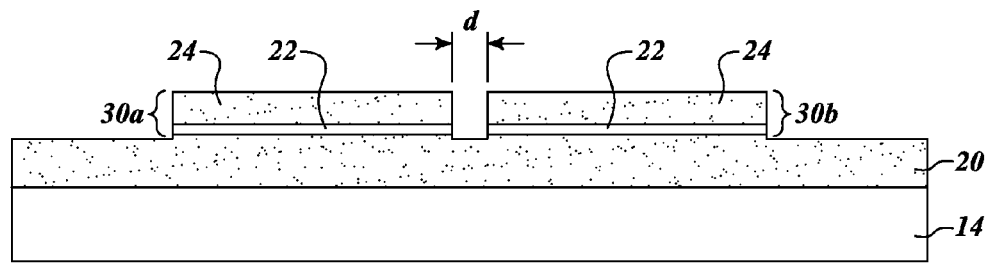
FIGS. 17 and 18 illustrate a cross-sectional view of another embodiment of silicon and SiGe according to principles of the present invention.
Figure 18:
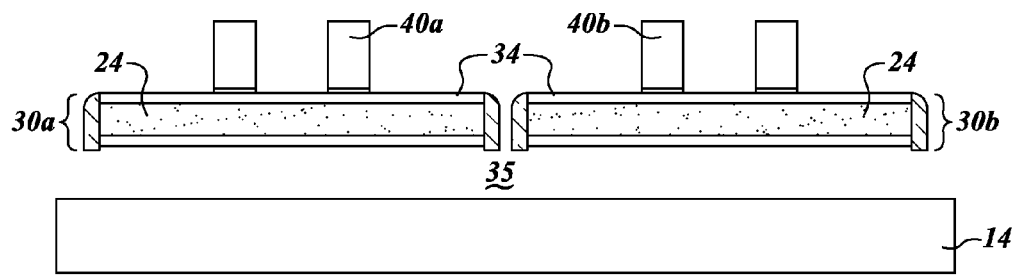

FIGS. 17 and 18 show yet an additional embodiment with particular advantages. FIG. 17 shows two laminate semiconductor structures 30a and 30b positioned closely adjacent to each other. They may be as close to each other as line widths will allow, and the distance d between them may correspond to a minimum line width of the semiconductor circuit. The semiconductor laminate structure 30a is doped N-type and the structure 30b is doped P-type in one embodiment. In other embodiments, they are both doped of the same type. The structures 30a and 30b are sufficiently close to each other such that under normal circumstances unacceptable latch-up or parasitic effects may occur through the respective body regions.

Some circuit configurations are of the type that are susceptible to latch-up or noise. In the prior art the individual transistors in these circuits are separated by trench isolation, sometimes requiring extensive counter doping and other techniques to reduce interference, which degrade circuit performance. The individual transistors of the present invention are completely electrically isolated, a result being that each can be doped to a preferred level without the need to be concerned for effects on neighboring transistors, thus improving overall circuit performance.

FIG. 18 illustrates a subsequent step in the processes shown in FIG. 17. In the subsequent step, the underlying graded SiGe material 20 will be etched with a sacrificial etch, thus electrically isolating the N body region and the P body region from the silicon substrate 14 and also from each other. An air gap 35 is formed under the laminate structures 30a and 30b.

Appropriate sidewalls have been formed on the respective body regions as shown in FIG. 18. Gate electrodes 40a and 40b are formed overlying the respective laminate structures 30a and 30b. The additional steps to form full CMOS transistors, both P- and N-channel, are carried out on the structure shown in FIG. 18.

As can be seen in the embodiment of FIG. 18, P-channel and N-channel transistors can now be positioned close to each other, as close as the minimum dimension line widths of the photolithographic process permit. There is no need to provide a field oxide, shallow trench isolation, or other electrical isolation between the two transistors, as was necessary in the prior art. Instead, because the body regions in the laminate structure 30 act as the well regions and are completely electrically isolated from each other by the removal of the sacrificial SiGe layer, the respective body regions can be spaced as close to each other as minimum dimensions allow. The sidewall oxides can be made as thin as desired, while having a thickness sufficient to provide protection during etching and formation of the respective body regions isolated from the substrate.

According to the embodiment of FIGS. 17 and 18, various transistors, including P-channel and N-channel transistors can now be formed nearly abutting each other and consuming much less space than was possible in the prior art. Considerable wiring layers and long lines coupling transistors can also be saved since the transistors can now be spaced closer to each other than was possible in the prior art in which LOCOS (local oxidation of silicon) or trench isolation structures were needed. Considerable real estate on the chip was consumed by the need to place these electrical isolation barriers between the P-wells and N-wells in the substrate. According to the embodiment of FIGS. 17 and 18, full CMOS transistors can be positioned more closely adjacent to each other and thus achieve higher density on the chip.

FIG. 18 is shown at the stage that corresponds to FIG. 12 of the prior embodiment and appropriate additional steps are carried out similar to those shown in FIGS. 13 and 14 to complete the structures and form transistors.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A structure, comprising:
a substrate;
a first dielectric layer on the substrate, the first dielectric layer having a central portion and raised outer portions;
a first stack of layers on the first dielectric layer, the first stack of layers having a first edge and a second edge, the first stack of layers including:
a first biaxially strained single crystalline silicon layer over and in contact with the first dielectric layer;
a single crystalline SiGe layer over and in contact with the first biaxially strained single crystalline silicon layer;
a second biaxially strained single crystalline silicon layer over and in contact with the SiGe layer, the second biaxially strained single crystalline silicon layer having a source, a drain, and a channel region of a MOS transistor;
first sidewalls formed adjacent to the first edge and the second edge of the first stack of layers;
a first gate electrode strip on the first stack of layers, the first gate electrode strip having a first portion over the second biaxially strained single crystal silicon layer and a second portion adjacent to sides of the second biaxially strained single crystal silicon layer, a bottom surface of the second portion being closer to the substrate than the second biaxially strained single crystal silicon layer;
second sidewalls formed adjacent to the first gate electrode strip; and
a second dielectric layer between the first biaxially strained single crystalline silicon layer and the central portion of the first dielectric layer, the second dielectric layer being between the first sidewalls and the raised outer portions of the first dielectric layer, the second dielectric on exposed portions of a top surface of the second biaxially strained single crystalline silicon layer, and on the first gate electrode strip.

2. The structure of claim 1, further including a second stack of layers adjacent to the first stack of layers on the substrate, each being separated from the substrate by a respective portion of the first dielectric layer.

3. The structure of claim 1, further including:
a second gate electrode strip adjacent to the first gate electrode strip, the second gate electrode strip over the second biaxially strained single crystal silicon layer.

4. The structure of claim 1, further comprising:
a first and a second isolation structure formed in the substrate, the first stack of layers being positioned between the first and second isolation structure, the first edge of the first stack of layers being separated from the first isolation structure by the first dielectric layer and a first one of the first sidewalls and the second edge of the first stack of layers being separated from the second isolation structure by the first dielectric layer and a second one of the first sidewalls.

5. The structure of claim 1 wherein the first sidewalls have a lower surface that is below a lower surface of the first strained silicon layer.

6. The structure of claim 1 wherein the second sidewalls are on the second dielectric layer.

7. A device, comprising:
a substrate;
a dielectric layer over the substrate, the dielectric layer having a first central portion and a second outer portions that extend above the first central portion;
a stack of layers having outer edges, the stack of layers including:
a first single crystalline semiconductor layer above the first central portion of the dielectric layer and laterally adjacent to the second outer portions of the dielectric layer;
a second single crystalline semiconductor layer above the first single crystalline semiconductor layer;
first sidewalls formed on the edges of the stack of layers;
a channel region of a MOS transistor in the second single crystalline semiconductor layer;
a gate electrode formed above the channel region;
second sidewalls formed adjacent to the gate electrode; and
a second dielectric layer between the first single crystalline semiconductor layer and the first central portion of the first dielectric layer, the second dielectric layer between the first sidewalls and the second outer portions of the first dielectric layer, the second dielectric layer being on exposed portions of a top surface of the second single crystalline semiconductor layer, and on the gate electrode.

8. The device of claim 7 wherein the first single crystalline semiconductor layer is SiGe and the second single crystalline semiconductor layer is Si.

9. The device of claim 7 comprising a plurality of transistor regions, each transistor region including:
a respective portion of the first single crystalline semiconductor layer, the respective portions of the first single crystalline semiconductor layer being isolated from each other;
a respective portion of the second single crystalline semiconductor layer, the respective portions of the second single crystalline semiconductor layer being isolated from each other; and
a respective channel region of a respective MOS transistor in the respective portion of the second single crystalline semiconductor layer.

10. The device of claim 7 wherein the gate electrode has a first portion above the second single crystalline semiconductor layer.

11. The device of claim 10 comprising a third single crystalline semiconductor layer between the first and the second semiconductor layer, a second portion of the gate electrode extending downward along the edges of the stack of layers.

12. The device of claim 11 wherein the third single crystalline semiconductor layer is SiGe.

13. The device of claim 7 comprising source and drain regions of the MOS transistor in the second single crystalline semiconductor layer.

14. A device, comprising:
a substrate;
a first isolation region and a second isolation region extending from the substrate;
a first dielectric layer above the substrate and between the first and second isolation regions, the first dielectric layer having a central portion and raised outer portions;
a stack of semiconductor layers above the central portion of the first dielectric layer and between the raised outer portions of the first dielectric layer; and
a gate electrode formed on the stack of semiconductor layers;
first sidewalls on edges of the stack of semiconductor layers, the first sidewalls separating the edges of the stack of semiconductor layers from the raised outer portion of the first dielectric layer; and
a second dielectric layer that separates a first layer of the stack of semiconductor layers from the central portion of the first dielectric layer, separates the first sidewalls from the raised outer portions of the first dielectric layer, covers exposed portions of a top surface of a second layer of the stack of semiconductor layers, and covers the gate electrode.

15. The device of claim 14, further comprising second sidewalls adjacent to the gate electrode, the second dielectric layer separating the gate electrode from the second sidewalls.

16. The device of claim 14 wherein the stack of semiconductor layers includes:
- a first single crystalline semiconductor layer formed on the central portion of the first dielectric layer;
- a silicon germanium layer formed on the first single crystalline semiconductor layer; and
- a second single crystalline semiconductor layer formed on the silicon germanium layer, the gate electrode being formed on the second single crystalline semiconductor layer.

* * * * *